(12) United States Patent
Bedell et al.

(10) Patent No.: US 9,496,186 B1
(45) Date of Patent: Nov. 15, 2016

(54) UNIFORM HEIGHT TALL FINS WITH VARYING SILICON GERMANIUM CONCENTRATIONS

(71) Applicant: INTERNATIONAL BUSINESS MACHINES CORPORATION, Armonk, NY (US)

(72) Inventors: Stephen W. Bedell, Wappingers Falls, NY (US); Bruce B. Doris, Slingerlands, NY (US); Keith E. Fogel, Hopewell Junction, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/085,068

(22) Filed: Mar. 30, 2016

Related U.S. Application Data

(63) Continuation of application No. 14/856,930, filed on Sep. 17, 2015.

(51) Int. Cl.
  *H01L 21/00* (2006.01)
  *H01L 21/84* (2006.01)
  *H01L 29/161* (2006.01)

(52) U.S. Cl.
  CPC .......... *H01L 21/845* (2013.01); *H01L 29/161* (2013.01)

(58) Field of Classification Search
  CPC .................. H01L 21/845; H01L 29/161
  See application file for complete search history.

(56) References Cited

U.S. PATENT DOCUMENTS

| 8,828,818 B1 | 9/2014 | Rodder |
| 2015/0028454 A1 | 1/2015 | Cheng et al. |
| 2015/0270344 A1 | 9/2015 | Reznicek et al. |

OTHER PUBLICATIONS

List of IBM Patents or Patent Applications Treated as Related—Date Filed: Jul. 5, 2016; 1 page.
Stephen W. Bedell, et al.; "Uniform Height Tall Fins With Varying Silicon Germanium Concentrations"; U.S. Appl. No. 14/856,930, filed Sep. 17, 2015.
Stephen W. Bedell, et al.; "Uniform Height Tall Fins With Varying Silicon Germanium Concentrations"; U.S. Appl. No. 14/968,313, filed Dec. 14, 2015.

*Primary Examiner* — Jarrett Stark
(74) *Attorney, Agent, or Firm* — Cantor Colburn LLP; Vazken Alexanian

(57) ABSTRACT

A method of making a semiconductor device includes forming a first fin in a first semiconducting material layer disposed over a substrate, the first semiconducting material layer comprising an element in a first concentration; and forming a second fin in a second semiconducting material layer disposed over the substrate and adjacent to the first semiconducting material layer, the second semiconducting material layer comprising the element in a second concentration; wherein the first concentration is different than the second concentration.

1 Claim, 8 Drawing Sheets

UNIFORM HEIGHT TALL FINS WITH VARYING SILICON GERMANIUM CONCENTRATIONS

DOMESTIC PRIORITY

This application is a continuation of U.S. patent application Ser. No. 14/856,930, filed Sep. 17, 2015, the disclosure of which is incorporated by reference herein in its entirety.

BACKGROUND

The present invention relates to metal-oxide-semiconductor field-effect transistors (MOSFET), and more specifically, to fin-type field-effect transistors (FinFET).

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

The FinFET is a type of MOSFET. The FinFET is a double-gate silicon-on-insulator (SOI) device that mitigates the effects of short channels and reduces drain-induced barrier lowering. The "fin" refers to the narrow channel between source and drain regions. A thin insulating oxide layer on either side of the fin separates the fin from the gate.

SUMMARY

According to an embodiment, a method of making a semiconductor device includes forming a first fin in a first semiconducting material layer disposed over a substrate, the first semiconducting material layer including an element in a first concentration; and forming a second fin in a second semiconducting material layer disposed over the substrate and adjacent to the first semiconducting material layer, the second semiconducting material layer including the element in a second concentration; wherein the first concentration is different than the second concentration.

According to another embodiment, a method of making a semiconductor device includes etching trenches in a semiconducting material disposed over a substrate to form a first active area and a second active area in the semiconducting material, the first active area being adjacent to the second active area; recessing the semiconducting material of the first active area and the second active area to different depths; growing a first epitaxial layer over the semiconducting material of the first active area and a second epitaxial layer over the semiconducting material of the second active area, the first epitaxial layer and the second epitaxial layer comprising a common element; performing a thermal mixing process to merge the first epitaxial layer with the semiconducting material of the first active area, distribute the common element of the first epitaxial layer within the semiconducting material of the first active area, and form a first merged active area comprising the first epitaxial layer and the semiconducting material of the first active area; and to merge the second epitaxial layer with the semiconducting material of the second active area, distribute the common element of the second epitaxial layer within the semiconducting material of the second active area, and form a second merged active area comprising the second epitaxial layer and the semiconducting material of the second active area, the first merged active area and the second merged active area comprising the common element in different concentrations; forming a first fin in the first merged active area; and forming a second fin in the second merged active area.

Yet, according to another embodiment, a semiconductor device includes a first fin disposed over a substrate, the first fin including a semiconductor material including an element in a first concentration; and a second fin disposed over the substrate and adjacent to the first fin, the second fin including a semiconductor material including the element in a second concentration; wherein the first concentration is different than the second concentration.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-7 illustrate an exemplary method of making semiconductor devices according to various embodiments, in which:

FIG. 1 is a cross-sectional side view of a buried oxide (BOX) layer and silicon-on-insulator (SOI) disposed over a substrate;

FIG. 2 is a cross-sectional side view after forming shallow trench isolation (STI) regions within the SOI to form two SOI regions that form active areas;

FIG. 3 is a cross-sectional side view after recessing the two SOI regions to different depths;

FIG. 5 is a cross-sectional side view after disposing a hard mask layer over the epitaxial layers;

FIG. 6 is a cross-sectional side view after thermal mixing to substantially uniformly distribute the epitaxial elements in the active regions; and FIG. 7 is a cross-sectional side view after forming fins.

DETAILED DESCRIPTION

Figure 1:
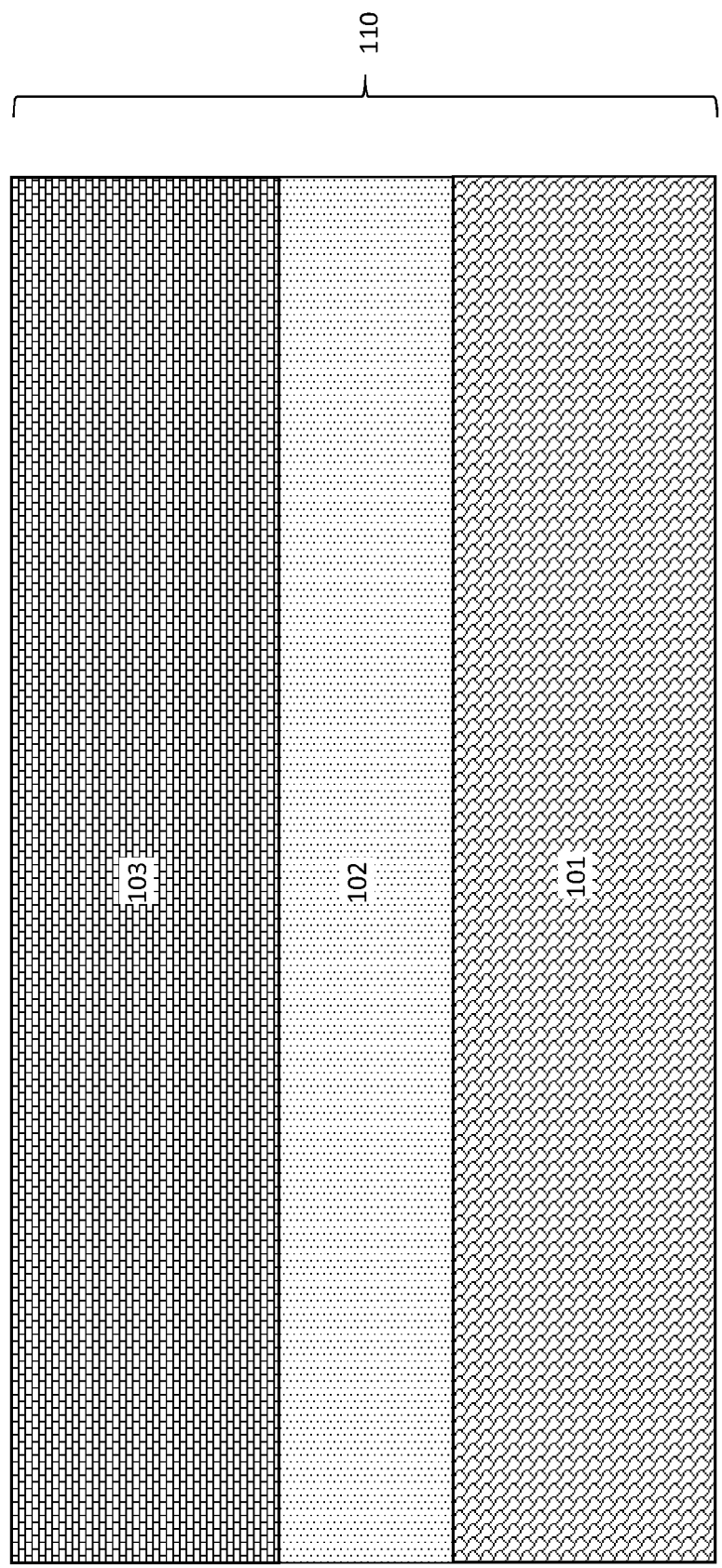

As semiconductor device dimensions get smaller, taller fins may be used to improve device current densities. Fins including silicon germanium (SiGe) are also used to improve performance. Some applications, such as system-on-chip (SoC) applications, use fins with different SiGe concentrations.

Multiple threshold (Vt) technology, which utilizes transistors with multiple threshold voltages to optimize delay or power, is one technology used in SoC systems. Fully depleted devices, such as FinFET devices, may use work function tuning to achieve different threshold voltages. However, channel doping may not be effective to accomplish the work function tuning, and the current integration scheme used to enable multiple threshold voltages is complex.

Accordingly, various embodiments described herein provide a structure and process to provide multiple Vt devices having fins of substantially uniform height. The structure and methods described provide at least two transistors with tall, substantially uniform fins with varying SiGe concentrations. Embodiments of the inventive structure and methods provide multiple transistors, on the same chip, with fins having different threshold voltages. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIGS. 1-7 illustrate an exemplary method of making semiconductor devices according to various embodiments. FIG. 1 is a cross-sectional side view of a buried oxide (BOX) layer 102 and silicon-on-insulator (SOI) 103 disposed over a substrate 101. The substrate 101, BOX layer 102, and SOI 103 form a SOI wafer.

Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

The thickness of the substrate 101 generally varies and is not intended to be limited. In one aspect, the thickness of the substrate 101 is in a range from about 50 micrometers to about 2000 micrometers.

The buried oxide (BOX) layer 102 is disposed over the substrate 101. The BOX layer 102 is an oxide, for example silicon dioxide, or a nitride, for example, silicon nitride. The thickness of BOX layer 102 generally varies and is not intended to be limited. In one aspect, the thickness of the BOX layer 102 is in a range from about 10 nm to about 1000 nm.

The SOI 103 is a semiconducting material that includes silicon or silicon germanium. The thickness of the SOI 103 generally varies and is not intended to be limited. In one aspect, the thickness of the SOI 103 is in a range from about 10 nm to about 1000 nm. In another aspect, the thickness of the SOI 103 is in a range from about 30 nm to about 100 nm.

Depending on the type of device, the SOI 103 may include more than one type of material, for example, semiconducting materials. In an exemplary embodiment, the SOI 103 includes silicon for forming an NFET and silicon germanium for forming a PFET. In other exemplary embodiments, the SOI 103 includes one type of material, for example, silicon for forming NFETS or silicon germanium for forming PFETs.

Figure 2:
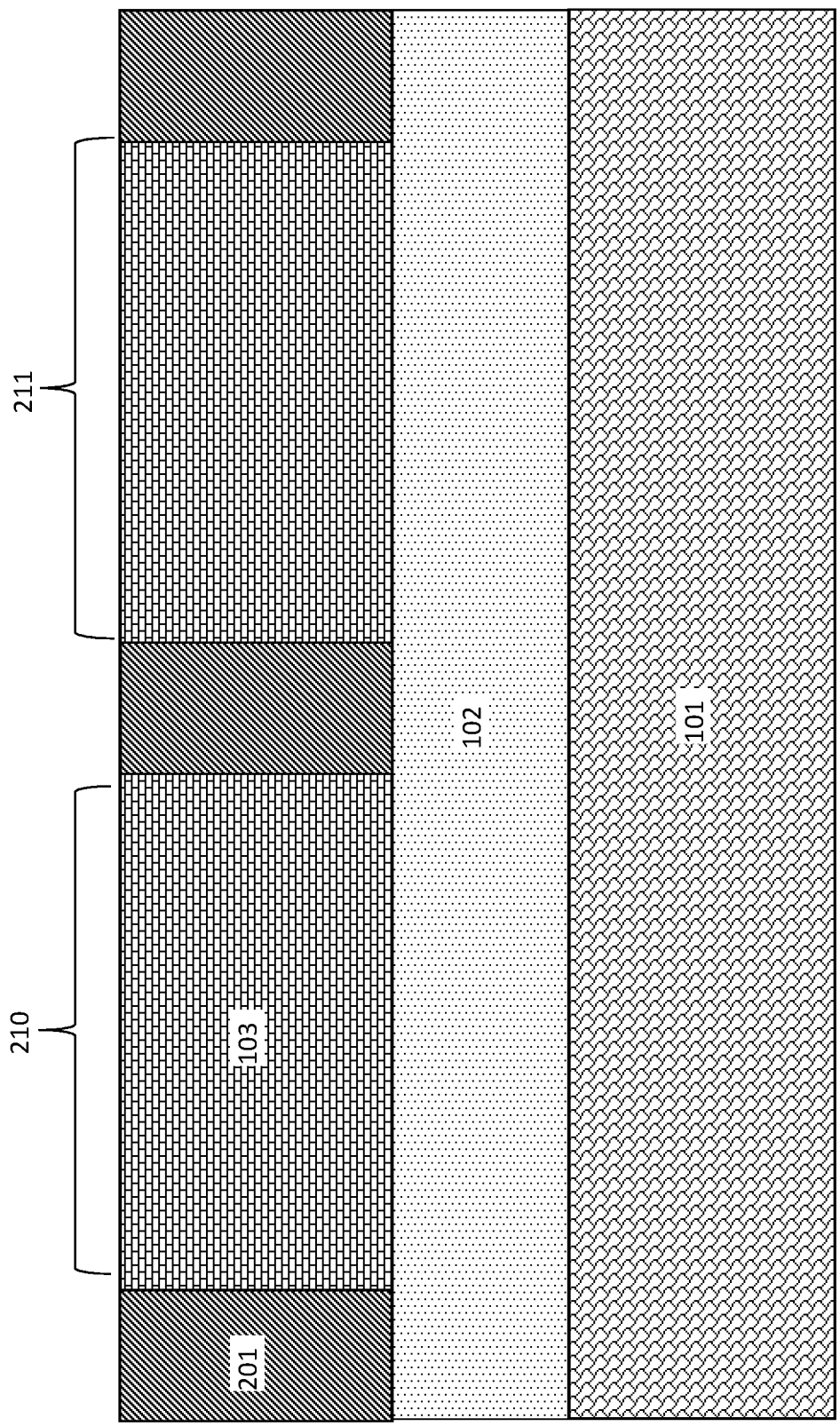

FIG. 2 is a cross-sectional side view after forming shallow trench isolation (STI) regions 201 within the SOI 103 to form two discrete SOI regions, first SOI region 210 and second SOI region 211. First SOI region 210 forms the active area of a first transistor (first active area). Second SOI region 211 forms the active area of a second transistor (second active area). The first and second transistors may be the same type (e.g., PFET transistors). In other embodiments, the first and second SOI regions 210, 211 include different semiconducting materials to form different transistors (e.g., an NFET and a PFET). The STI regions 201 will later function as a planarization stop, as shown in FIG. 4B described below.

The STI regions 201 are isolation regions formed by etching trenches in the SOI 103 and then filling the trenches with, for example, silicon dioxide. Other suitable oxide materials may be deposited to form the STI regions 201. Non-limiting examples of suitable oxide materials for the STI regions 201 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof.

Figure 3:
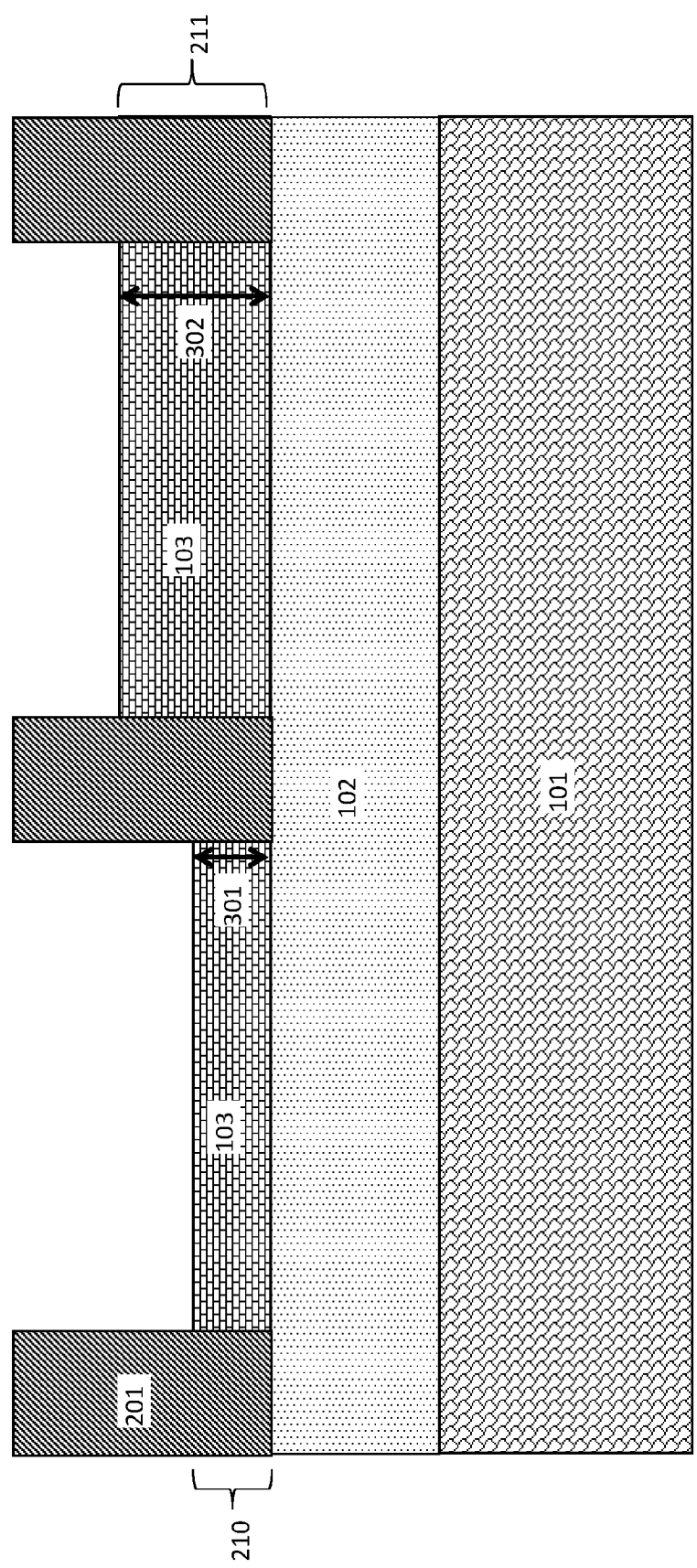

FIG. 3 is a cross-sectional side view after recessing the first and second SOI regions 210, 211. The first and second SOI regions 210, 211 are recessed by different amounts (different depths) by removing different amounts of the SOI 103.

The first SOI region 210 is recessed to form a SOI 103 having a thickness 301 (first thickness) in a range from about 4 to about 100 nm. In some embodiments, the first SOI region 210 is recessed to form a SOI 103 having a thickness 301 in a range from about 6 to about 20 nm.

The second SOI region 211 is recessed to form a SOI 103 having a thickness 302 (second thickness) in a range from about 10 to about 100 nm. In some embodiments, the second SOI region 211 is recessed to form a SOI 103 having a thickness 302 in a range from about 8 to about 30 nm.

The first and second SOI regions 210, 211 are recessed to different depths in active regions of different transistors by disposing a mask (not shown) over the either side (first or second SOI region 210, 211) and etching the respective exposed SOI 103 that is uncovered by the mask. For example, a mask may be disposed over the first SOI region 210, followed by etching of the second SOI region 211. In another example, a mask is disposed over the second SOI region 211, followed by etching the first SOI region 210. The mask is removed, and the un-etched SOI 103 (first or second SOI region 210) is covered by another mask (not shown). The respective uncovered SOI 103 is then etched, and the second mask is removed.

The mask may be any suitable resist. Suitable resists include photoresists, electron-beam resists, ion-beam resists, X-ray resists, and etchant resists. The resist may a polymeric spin on material or a polymeric material. The mask may be removed by, for example, an ashing process.

The etching process employed to recess the SOI 103 may be any suitable reactive ion etching (RIE) process. Non-limiting examples of suitable etching processes include silicon etching methods selective to oxides.

Figure 4A:
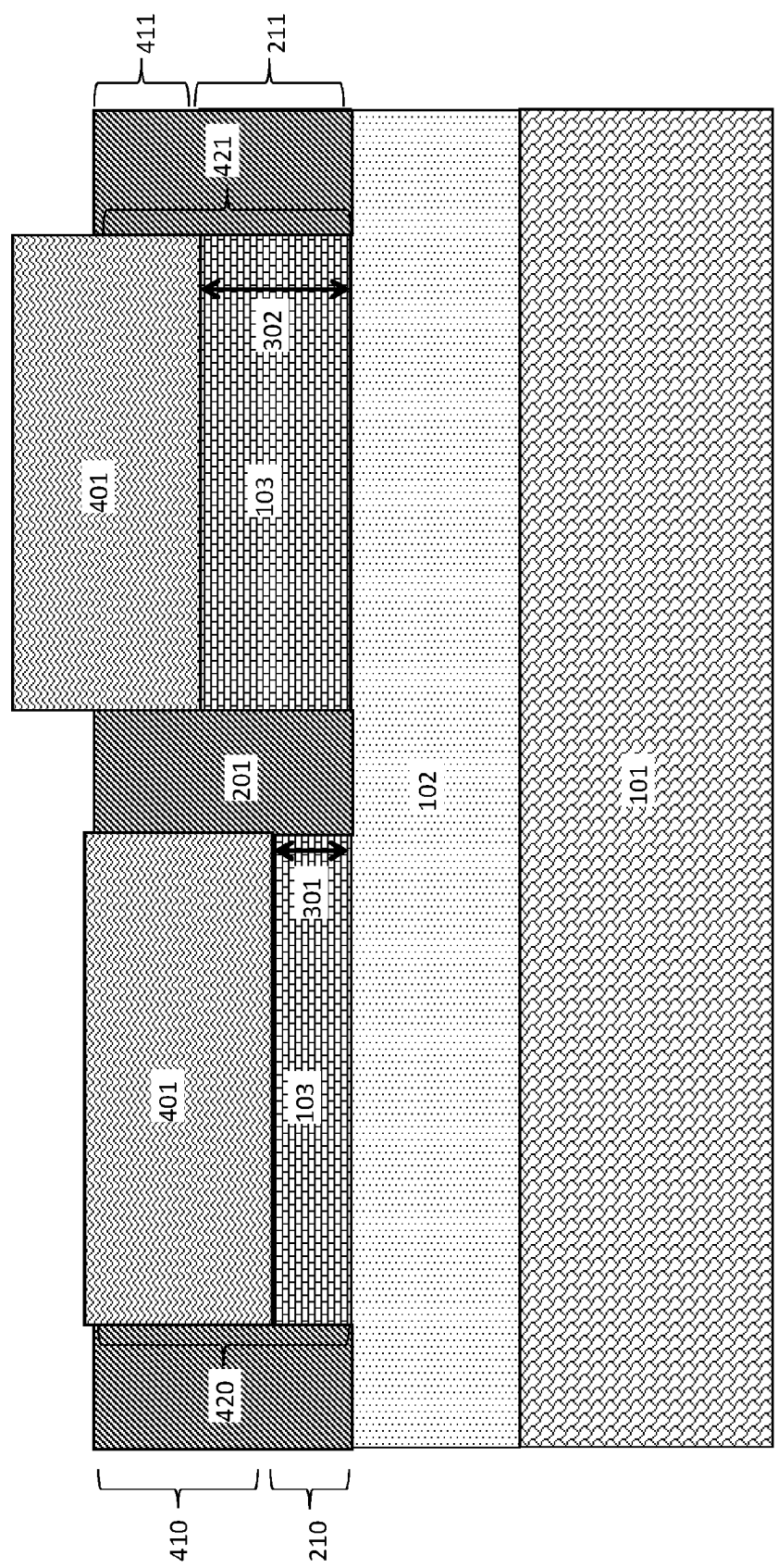
FIG. 4A is a cross-sectional side view after growing epitaxial layers over the two SOI regions.
Figure 4B:
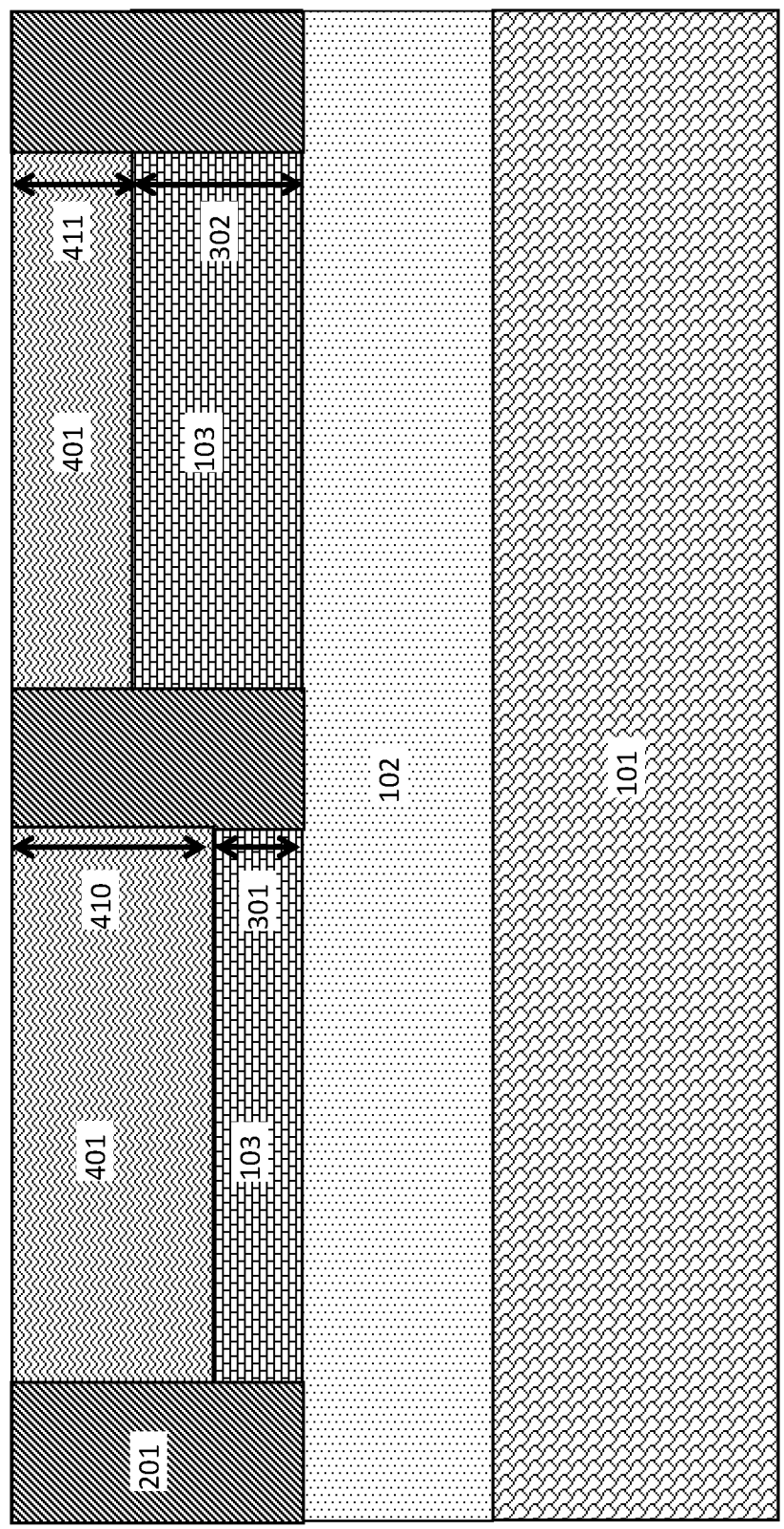
FIG. 4B is a cross-sectional side view after planarizing the epitaxial layers.

FIG. 4A is a cross-sectional side view after depositing an epitaxial layer 401 over the recessed SOI 103 of the first and second SOI regions 210, 211 to form first epitaxial layer 410 and second epitaxial layer 411. First SOI region 210 and second SOI region 410 form a first active region 420 of a first transistor. Second SOI region 211 and second epitaxial layer 411 form a second active region 421 of a second transistor.

The first and second epitaxial layers 410, 411 make up at least 40 atomic % (at. %) of the first and second active regions 420, 421, respectively. In some embodiments, the first and second epitaxial layers 410, 411 make up from about 40 to about 70 at. % of the first and second active regions 420, 421, respectively. In other embodiments, the first and second epitaxial layers 410, 411 make up from about 40 to about 90 at. % of the first and second active regions 420, 421, respectively.

An epitaxial growth process is used to form the epitaxial layers 401 specifically over the SOI 103. The epitaxial growth process is performed to grow a crystalline layer of silicon germanium onto the crystalline SOI 103 beneath. The underlying silicon of the SOI 103 acts as a seed crystal. Epitaxial layers 401 may be grown from gaseous or liquid precursors. A non-limiting example of a suitable material (element) for the epitaxial layers 401 includes silicon germanium. The silicon germanium may have a germanium content of about 40 to about 70 atomic % (at. %).

The epitaxial layers 401 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The thickness of the first and second epitaxial regions 410, 411 is substantially the same because they will be formed concomitantly through the patterned mask. Because the thickness of the SOI 103 in the first and second SOI regions 210, 211 is different, first and second epitaxial regions 410, 411 will protrude over the STI regions 201 by different amounts.

FIG. 4B is a cross-sectional side view after planarizing the epitaxial layers 401. The planarizing process may include, for example, a chemical mechanical planarization (CMP) process.

Figure 5:
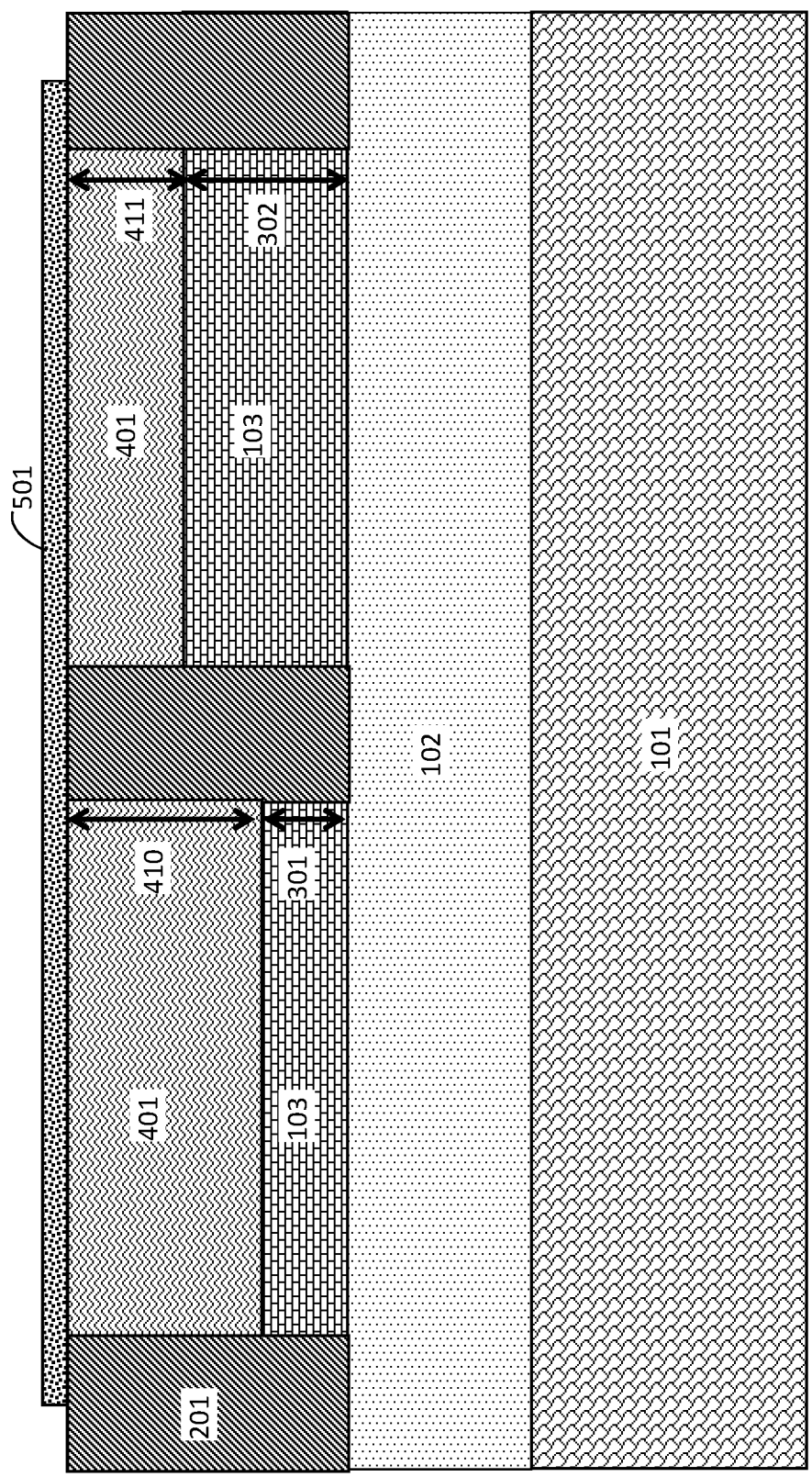

FIG. 5 is a cross-sectional side view after disposing an optional insulating layer 501 (hard mask layer) over the epitaxial layers 401. The insulating layer 501 prevents oxidation of the epitaxial layers 401 during the thermal mixing process (see FIG. 6) by forming a capping layer. The insulating layer 501 also maintains the shape of the surface of the epitaxial layers 401 by preventing surface rearrangement during thermal mixing annealing. The insulating layer should be thick enough to prevent oxygen from penetrating through to the epitaxial layers 401.

The insulating layer 501 includes a suitable insulating or hard mask material. Non-limiting examples of suitable materials for the insulating layer 501 include silicon nitride, silicon oxide, silicon dioxide, aluminum oxide, or a combination thereof. The insulating layer 501 may be formed using a suitable deposition process, including, but not limited to CVD, PVD, plasma enhanced CVD, atomic layer deposition (ALD), evaporation, chemical solution deposition, or like processes.

The thickness of the insulating layer 501 may generally vary and is not intended to be limited. In some embodiments, the thickness of the insulating layer 501 is in a range from about 20 to about 200 nm. In other embodiments, the thickness of the insulating layer 501 is in a range from about 50 to about 100 nm.

Figure 6:
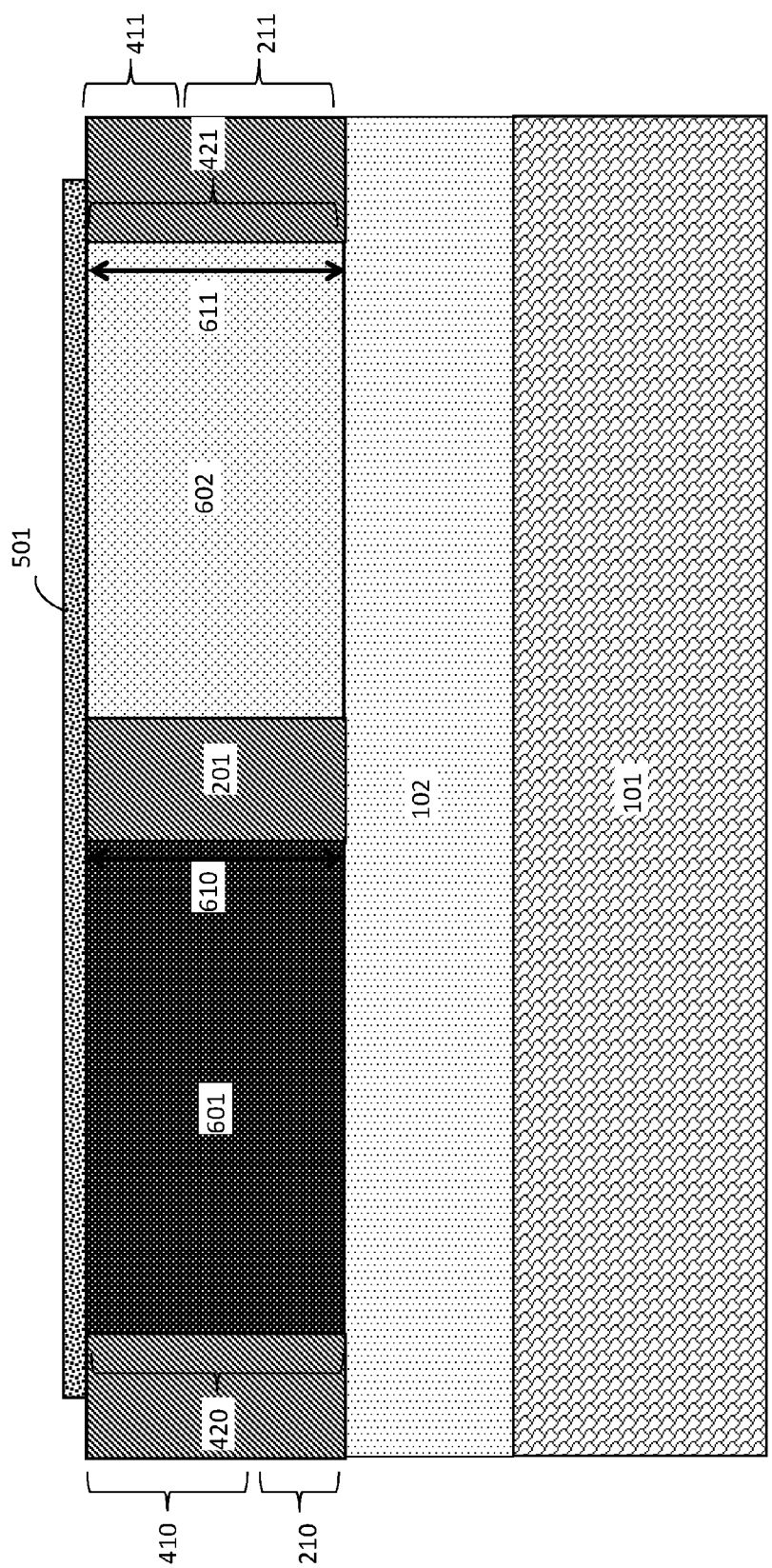

FIG. 6 is a cross-sectional side view after thermal mixing to substantially uniformly distribute elements from the epitaxial layers 401 within first and second active regions 420, 421. Thermal mixing combines the composition of the first SOI region 210 with the first epitaxial layer 410 and the composition of the second SOI region 211 with the second epitaxial layer 411 to form merged active areas (first and second merged active areas). Because the first epitaxial layer 410 and the second epitaxial layer 411 have different thicknesses and make up different proportions of the total active regions (first and second active regions 420, 421), the resulting final active regions (first active region 601 and second active region 602) include different elemental concentrations. First active region 601 includes more or less of at least one element (e.g., germanium). The first active region 601 and the second active region 602 include a common element. The common element is present in different concentrations in the first and second active regions 601, 602.

Thermal mixing is a thermal diffusion process that is performed at a temperature sufficient enough to cause diffusion of germanium out of the epitaxial layers 401 and into the SOI 103. In one embodiment, the thermal mixing is performed at a temperature from about 700° C. to about 1300° C. In another embodiment, the thermal mixing is performed at a temperature from about 1000° C. to about 1200° C.

In other embodiments, the thermal mixing is performed in the present of an inert ambient gas. Non-limiting examples of inert gases include helium (He), argon (Ar), nitrogen ($N_2$), xenon (Xe), krypton (Kr), or neon (Ne), or any combination thereof.

The thermal mixing process of the present application may be carried out for a variable period of time. In one example, the thermal mixing process is carried out for a time period from 2 minutes to about 5 hours, depending on thermal mixing temperature. In another embodiment, the thermal mixing process may be carried out for a time period from 5 minutes to about 30 minutes. The thermal mixing process of the present application may be carried out at a single targeted temperature, or various ramp and soak cycles using various ramp rates and soak times can be employed.

The first active region 601 and second active region 602 include different amounts of at least one element. In one exemplary embodiment, first and second SOI regions 210, 211 include silicon, and first and second epitaxial layers 410, 411 include silicon germanium. The first and second active regions 601 include different amounts of germanium. In some embodiments, first active region 601 includes a higher amount of germanium than second active region 602. In other embodiments, first active region 601 includes germanium in an amount in a range from about 20 at. % to about 60 at. % and silicon in an amount in a range from about 40 at. % to about 80 at. %. Second active region 602 includes germanium in an amount in a range from about 10 atomic percent to about 20 atomic percent and silicon in an amount in a range from about 80 at. % to about 90 at. %.

Figure 7:
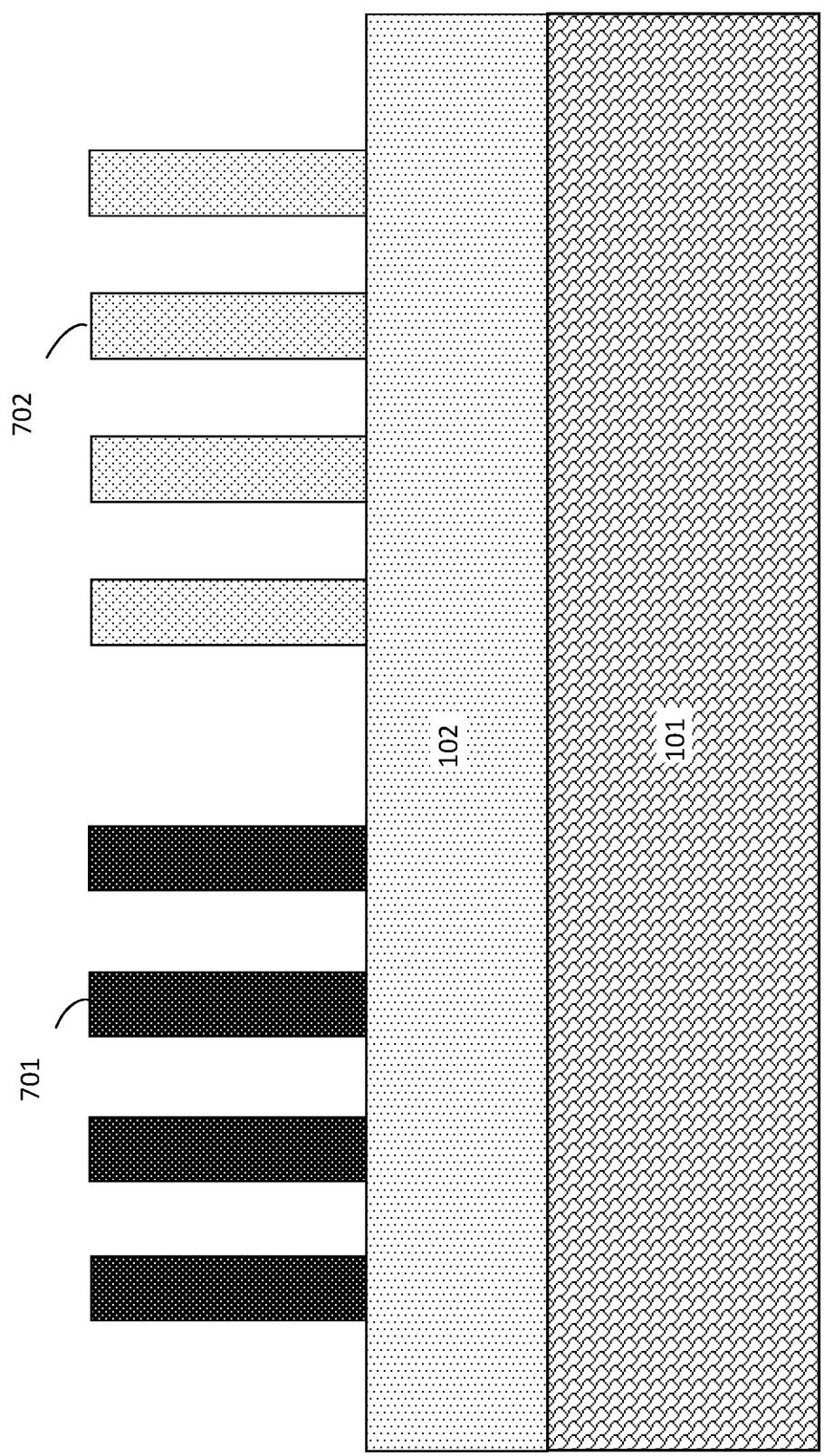

FIG. 7 is a cross-sectional side view after forming fins in the first and second active regions 601, 602. First fins 701 are formed in the first active region 601. Second fins 702 are formed in the second active region 602. The first and second fins 601, 602 have different elemental concentrations for forming two different transistors.

In an exemplary embodiment, first and second fins 601, 602 include different concentrations of silicon germanium. First and second fins 601, 602 have different threshold voltages.

When the insulating layer 501 is used, the insulating layer 501 is removed before patterning first and second fins 701, 702. The insulating layer is removing by employing an etching process, for example, a wet etching process. Non-limiting examples of suitable methods for etching the insulating layer 501 include processes including aqueous hydrofluoric acid (HF) when the insulating layer 501 is silicon dioxide and hot phosphoric acid when the insulating layer 501 is silicon nitride.

The STI regions 201 are recessed during fin formation, described below. Etching processes, for example, wet etching processes with aqueous HF, may also be used to recess the STI regions 201.

The first and second fins 601, 602 may be formed in the first and second active regions 601, 602 by a lithographic patterning and etching process. The first and second fins 601, 602 have different threshold voltages due to the different elemental concentrations (e.g., different silicon germanium concentrations). In one non-limiting example, a hard mask material (not shown) may be disposed over the first and second active regions 601, 602. The first and second fins 601, 602 are formed by etching material from the first and second active regions 601, 602 using a suitable etching process such as reactive ion etching (RIE).

To form fins (first and second fins 601, 602) with substantially uniform height, a sidewall image transfer (SIT) process is employed. The height of the first and second fins 601, 602 generally varies, as it depends on the type of device, and is not intended to be limited. In one aspect, the height of the first and second fins 601, 602 is in a range from about 20 nm to about 150 nm. In another aspect, the height of the first and second fins 601, 602 is in a range from about 30 nm to about 80 nm. In some embodiments, the height of the first and second fins 601, 602 is substantially the same.

As described above, various embodiments described herein provide a structure and process to provide multiple Vt devices having fins of uniform height. The structure and methods described provide at least two transistors with tall, substantially uniform fins with varying elemental (e.g., SiGe) concentrations. Embodiments of the inventive structure and methods provide multiple transistors, on the same chip, with fins having different threshold voltages.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
    etching trenches in a semiconducting material disposed over a substrate to form a first active area and a second active area in the semiconducting material, the first active area being adjacent to the second active area;
    recessing the semiconducting material of the first active area and the second active area to different depths;
    growing a first epitaxial silicon germanium layer over the semiconducting material of the first active area and a second epitaxial silicon germanium layer over the semiconducting material of the second active area, the first epitaxial silicon germanium layer and the second epitaxial silicon germanium layer protruding over shallow trench isolation regions between the first active area and the second active area by different amounts;
    planarizing the first epitaxial silicon germanium layer and the second epitaxial silicon germanium layer;
    disposing an insulating hard mask on the first epitaxial silicon germanium layer and the second epitaxial silicon germanium layer;
    performing a thermal mixing process to merge the first epitaxial silicon germanium layer with the semiconducting material of the first active area, distribute silicon germanium of the first epitaxial silicon germanium layer within the semiconducting material of the first active area, and form a first merged active area comprising the first epitaxial silicon germanium layer and the semiconducting material of the first active area; and to merge the second epitaxial silicon germanium layer with the semiconducting material of the second active area, distribute silicon germanium of the second epitaxial silicon germanium layer within the semiconducting material of the second active area, and form a second merged active area comprising the second epitaxial silicon germanium layer and the semiconducting material of the second active area, the first merged active area and the second merged active area comprising silicon germanium having different germanium contents;
forming a first fin in the first merged active area; and
forming a second fin in the second merged active area.

* * * * *